United States Patent [19]
Kurokami et al.

[11] Patent Number: 6,111,188
[45] Date of Patent: Aug. 29, 2000

[54] SOLAR CELL ARRAY AND SOLAR POWER GENERATION APPARATUS USING IT

[75] Inventors: Seiji Kurokami, Kyotanabe; Nobuyoshi Takehara, Soraku-gun; Naoki Manabe, Nara, all of Japan

[73] Assignee: Canon Kabushiki Kaisha, Tokyo, Japan

[21] Appl. No.: 09/008,559

[22] Filed: Jan. 16, 1998

[30] Foreign Application Priority Data

Jan. 21, 1997 [JP] Japan ................................. 9-008656
Jan. 6, 1998 [JP] Japan ................................. 10-000852

[51] Int. Cl.$^7$ .................................................. H01L 25/00
[52] U.S. Cl. ........................................... 136/244; 136/293
[58] Field of Search ...................... 136/244, 293

[56] References Cited

U.S. PATENT DOCUMENTS

| | | | |
|---|---|---|---|
| 4,353,161 | 10/1982 | Turner | 29/572 |
| 5,118,361 | 6/1992 | Fraas et al. | 136/246 |
| 5,131,341 | 7/1992 | Newman | 136/291 |
| 5,213,626 | 5/1993 | Paetz | 136/244 |
| 5,616,185 | 4/1997 | Kukulka | 136/244 |
| 5,779,817 | 7/1998 | Wecker | 136/244 |

FOREIGN PATENT DOCUMENTS

| | | |
|---|---|---|
| 0751576 | 1/1997 | European Pat. Off. . |
| 6-311651 | 11/1994 | Japan . |

OTHER PUBLICATIONS

Patent Abstracts of Japan, vol. 098, No. 003, Feb. 1998 for JP 09–294340.

Patent Abstract of Japan, vol. 095, No. 002, Mar. 1995 for JP 06–311651.

*Primary Examiner*—Mark Chapman
*Attorney, Agent, or Firm*—Fitzpatrick, Cella, Harper & Scinto

[57] ABSTRACT

A solar cell array is constructed by connecting plural solar cell strings in parallel, and the solar cell array is arranged to have strings of two or more rated voltages. This arrangement permits the solar cell array to be designed so as to maximize the output capacity in an area where the solar cells can be installed. In addition, the arrangement has high degrees of freedom of design to enable to construct a preferred configuration in terms of the design. Further, the solar cell array can be provided in a device configuration of low cost. Also provided is an array constructing method to facilitate installation and wiring.

28 Claims, 17 Drawing Sheets

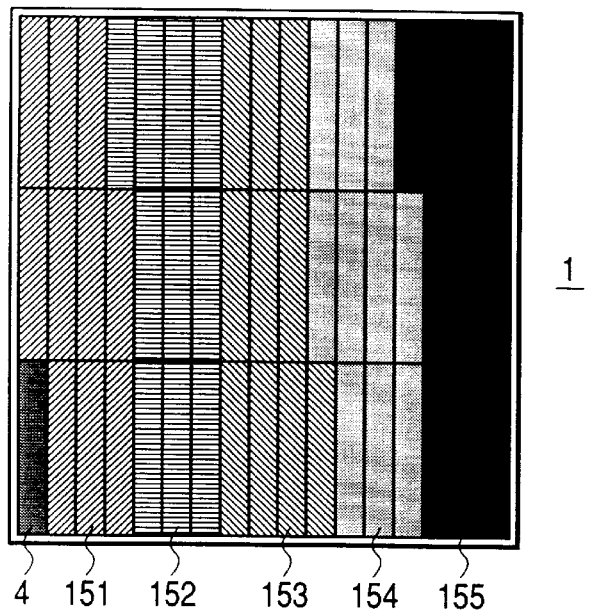
FIG. 6A
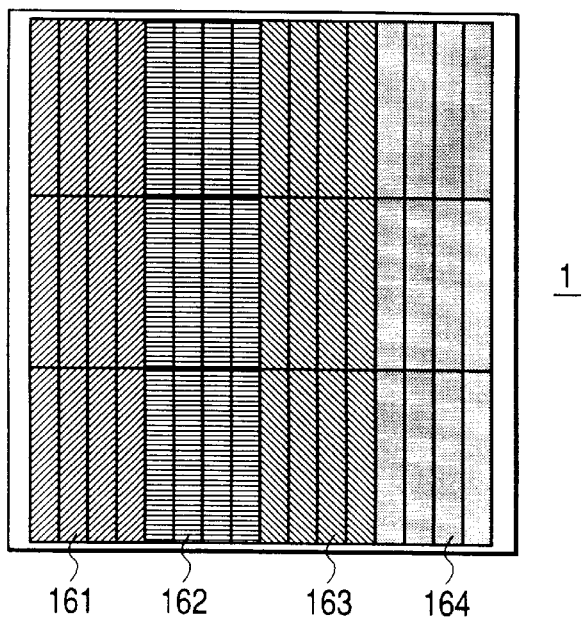
FIG. 6B
FIG. 7
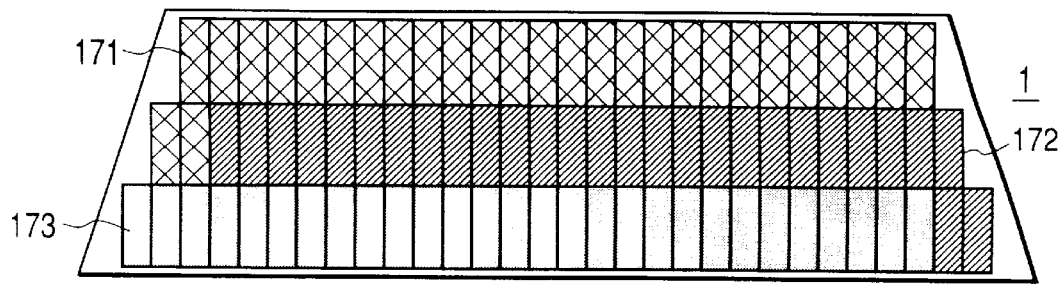

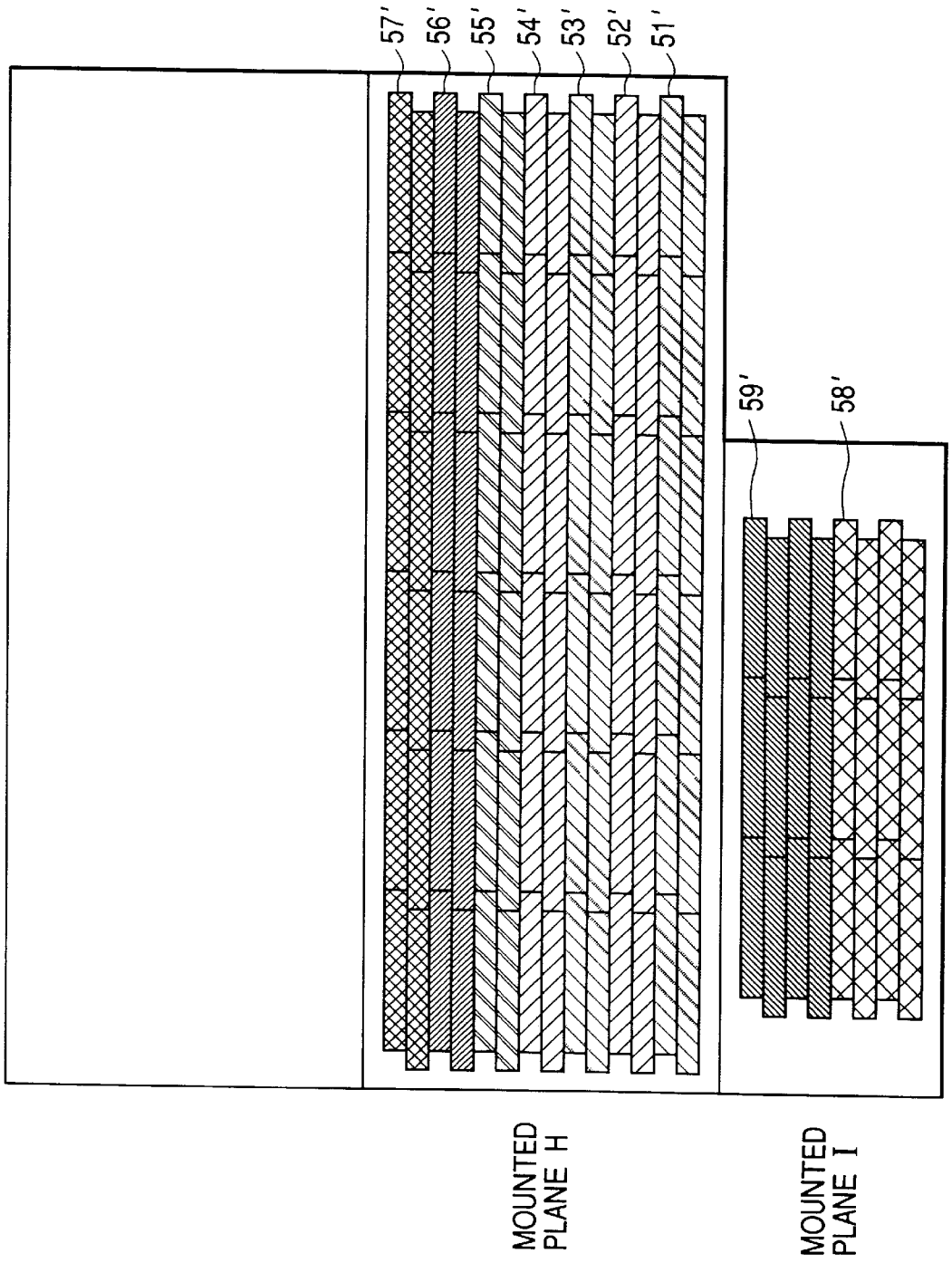

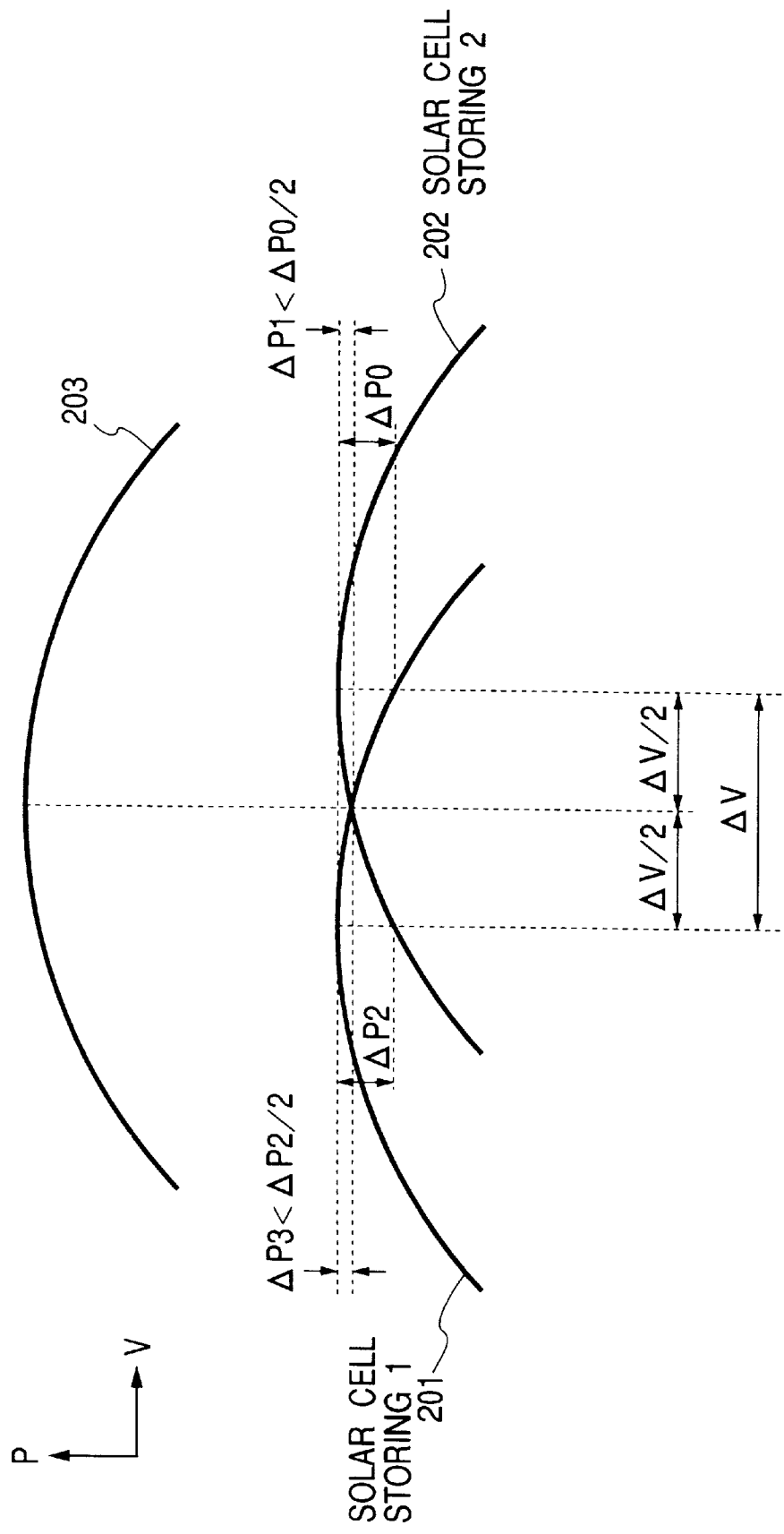

SOLAR CELL ARRAY AND SOLAR POWER GENERATION APPARATUS USING IT

BACKGROUND OF THE INVENTION

1. Field of the Invention

The present invention relates to configurations of solar cell array for solar electric power generation apparatus.

2. Related Background Art

Today, the increase in consciousness about the global environments is raising great hopes for the solar electric power generation apparatus as a clean energy source. In recent years, solar power generation-system interconnection devices for ordinary houses have become cheaper than before and still greater spread of solar power generation apparatus is expected in the future.

In constructing the solar power generation apparatus, solar cell strings are composed of solar cell modules connected in series so as to obtain a desired voltage, according to characteristics of the solar cell modules, and the solar cell strings are then connected in parallel so as to obtain a desired output capacity, thus composing a solar cell array.

In the system interconnection device, a selectable range of series number of solar cell modules is determined depending upon an input voltage into a system interconnection inverter, which is a receiver of the output from the solar cells. On the other hand, the maximum installation number of solar cell modules that can be installed is determined from the area of the place where the solar cells are installed, whereby the output capacity of the highest possible installation number of solar cells is also determined. Based thereon, the number A of series solar cell modules and the number B of parallel solar cell strings are determined so as to obtain a desired capacity, thereby constituting the solar cell array of A In series×B parallel strings of cells. Conventionally, it was common practice that the number A of solar cell modules composing each string was save for the all strings, so as to make the rated voltages of the respective solar cell strings equal to each other.

(1) For example, let us consider an example of installation on a roof where 51 solar cell modules can be installed as shown in FIGS. 6A and 6B. Let us suppose that the selectable number of series modules is in the range of 9 to 15 from the input voltage range of the inverter and the characteristics of the solar cell modules. The number of solar cell modules that can be installed in practice is one the multiples of 9, 10, 11, 12, 13, 14, or 15, but not to be more than 51. From this, the maximum installation number of solar cell modules is 50 and placement thereof is, for example, as shown in FIG. 6A. Solar cell strings 151, 152, 153, 154, 155 are constructed each by connecting 10 solar cell modules in series and these five solar cell strings are connected in parallel, thereby composing the solar cell array. A dummy module 4 is installed in a vacant area of the size of one solar cell module.

(2) Let us consider another example of installation in which the solar cell modules are installed on a south surface, an east surface, and a west surface of a roof as shown in FIG. 8. The solar cell modules used are building-material-incorporated solar cell modules SR-02 available from CANON Inc., and they are installed by the Dutch-lap method. The highest possible installation number of solar cell modules on each roof surface is determined depending upon the shape of roof surface and the above roofing method of modules; 73 modules on the mount plane A of the south surface; 14 modules on the mount plane B of the east surface; 14 modules on the mount plane C of the west surface. Supposing the inverter SI-04 available from CANON Inc. is used, the selectable number of series solar cell modules will be in the range of 10 to 20 from the input voltage range of the inverter and the characteristics of the solar cell modules. The number of solar cell modules that can be installed in practice on each roof surface is a multiples of some number between 10 and 20, inclusive. the configuration of 14 cells in series×5 parallel strings (solar cell strings 11' to 15') achieves the maximum installation number on the south surface, so that 70 modules can be installed on the south surface. In the case of the east surface and the west surface, the configuration of 14 in series×1 string (16', 17') achieves the maximum installation number, so that 14 modules can be installed on each of the east surface and the west surface. The total system is the configuration of 14 series×7 parallel string. There are three vacant areas 18 without a solar cell module on the south surface, and dummy modules are installed therein.

Another construction method of apparatus is a method for forming separate configurations of solar cell arrays on the respective mount planes and preparing an inverter per solar cell array. For the south surface, one solar cell array is constructed in the configuration of 18 series×4 parallel and one inverter is connected thereto. For either of the east surface and the west surface, an array can be constructed in the configuration of a solar cell string of 14 series, and they are combined to form a solar cell array of 14 series×2 parallel, to be connected to another inverter. In this way the two solar cell arrays are constructed and are connected to the respective inverters.

In the above construction method, the solar cell array formed on the east surface and the west surface can be changed to separate solar cell arrays, each on the corresponding roof surface. In this case, inverters for the east surface and for the west surface are prepared and are connected each to the associated solar cell array. Namely, the three solar cell arrays are constructed and the inverters are connected to the respective arrays.

However, the above methods have the following problems. Even if the output from the solar cells was desired to be maximized by installing as many solar cells as possible, there sometimes occurred such cases as to fail to utilize the all possible installation surfaces, because the conventional methods equaled the rated outputs of the respective solar cell strings or because the conventional methods equaled the numbers of solar cell modules forming the strings. In the aforementioned conventional example (1), though there are possible installation locations for 51 solar cell modules, only 50 modules can be installed owing to the array configuration and one position module cannot be utilized. In the aforementioned conventional example (2), though there are the possible installation locations for 73 solar cell modules on the south surface, only 70 modules out thereof can be installed owing to the array configuration and three rest modules cannot be installed.

With use of roof-material-incorporated solar cell modules, a dummy module having the same shape as the solar cell modules and incorporating no solar cell is installed as a roof material in each vacant module space, and the dummy module sometimes has a different tone of color, which is not preferable in terms of the design of the roof. In the case of the solar cell modules without the function of flashing, the dummy modules do not always have to be installed, but leaving a vacancy also is considerably undesirable in terms of the design.

In the conventional example (1), it is also possible to install 48 solar cell modules, as shown in FIG. 6B, giving a first priority to considerations of design in choosing among the possible installation numbers. In this case, however, the installation number is three smaller than the number of mountable locations, so that the output capacity is decreased further.

There are roofs in which the shape of mount plane is not rectangular; for example, a trapezoid like a hipped roof. In this case, since output terminals of solar cell string are not located at the edge of mount plane, wiring is not easy to find and the wiring work becomes troublesome.

In the case of the conventional example (2) where the plurality of solar cell arrays are constructed and the plural inverters are connected to the respective arrays, the extra inverter is necessary and the cost becomes higher thereby. If the output capacity of solar cell array is considerably smaller than the inverter capacity, the conversion efficiency of inverter will be lowered to decrease the electric energy obtained.

An object of the present invention is to provide a solar cell array that allows the maximum output capacity of solar cell array to be designed in the possible installation area of solar cell, that gives high degrees of freedom of design to permit a configuration preferred in terms of the design, and that is constructed in the device structure of low cost. Another object of the present invention is to provide an array construction method to facilitate installation and wiring.

SUMMARY OF THE INVENTION

Solving the above problems, the objects are achieved by a solar cell array in which a plurality of solar cell strings are connected in parallel, said solar cell array having two or more rated voltages of the solar cell strings.
(Action)

In general, a parallel combination of solar cell strings with different characteristics will result in a so-called IV mismatch loss because of failure in matching of IV curve. The "loss" referred to means that the maximum output of the solar cell array after completion of the parallel combination of solar cell strings becomes smaller than the sum of maximum powers of the individual solar cell strings, and it is defined by the following equation:

IV mismatch loss=1−[(maximum power of solar cell array)/(sum of maximum powers of individual solar cell strings)]

It has, therefore, been considered heretofore that even if the number of solar cell modules constituting the solar cell strings (only some strings) was increased the gain obtained would not correspond thereto. Therefore, the solar cell strings having an identical rated voltage were connected in parallel for forming the solar cell array.

The inventors, however, found from research that the decrease in the output was very small even with some difference in the voltage among the solar cell strings.

This is for the following reason. In the case wherein deviation is relatively small among optimum operating voltages of the respective solar cell strings and wherein a voltage-power characteristic curve of the solar cell array has only one peak, the optimum operating voltage of the solar cell array is located among the optimum operating voltages of the respective solar cell strings. As a result, voltage deviation amounts of the optimum operating voltages of the respective solar cell strings relative to the optimum operating voltage of the solar cell array are smaller than those among the solar cell strings. This limits the power decrease due to the voltage deviation. Especially, in the case wherein the shape of voltage-power characteristic is gentle near the optimum operating voltage of solar cell, the rate of power decrease is more restrained than the rate of decrease in the voltage deviation amounts, and the power decrease due to the IV mismatch is suppressed in the level where no problem arises in practical use.

This will be described referring to FIG. 20. The voltage-power characteristics of two solar cell strings 1 and 2 are indicated by 201, 202. The difference in the optimum operating voltage is $\Delta V$ between them. Supposing the operating voltage is shifted by $\Delta V$ from the optimum operating voltage, the output will be decreased by $\Delta P0$ in the string 1 and by $\Delta P2$ in the string 2. On the other hand, numeral 203 represents the voltage-power characteristic where the solar cell array is constructed by connecting the solar cell strings 1 and 2 in parallel. Let us suppose that the maximum output voltage of the solar cell array is the intermediate value between the maximum output voltages of the solar cell strings 1 and 2. Then, deviation amounts are $\Delta V/2$ between the optimum operating voltage of each string and the optimum operating voltage of the array, which is half of the deviation amount $\Delta V$ in the optimum operating voltage between the strings. The power decrease due to the voltage deviation is thus restrained in this way. Let us check the power decrease amount where the solar cell string 1 is incorporated in the array. The string 1 will operate in the power smaller by $\Delta P3$ at the point $\Delta V/2$ apart from the optimum operating point. When this is compared with the case wherein the string 1 operates at the point $\Delta V$ apart, i.e., wherein it operates in the power smaller by $\Delta P2$, the power decrease $\Delta P3$ described above is smaller than $\Delta P2/2$. Similarly, the power decrease amount $\Delta P1$ of the string 2 is smaller than $\Delta P0/2$. It is thus apparent that the power decrease amounts are relatively smaller than the voltage deviation amounts. This is true, particularly, for the cases wherein the peak of the voltage-power curve is gentle as shown in this figure (or for devices with small FF).

In the case of the solar cell array in which the solar cell modules are installed on a plurality of mount planes, each solar cell string is composed of solar cell modules placed on a single mount plane, whereby the optimum operating current of each solar cell module is identical in the solar cell string and whereby the IV mismatch loss is always minimized under ever-changing sunshine conditions.

The amorphous silicon solar cells are more suitable, because the shape of the voltage-power characteristic curve thereof is gentle near the optimum operating point and the power decrease is thus particularly by low.

Particularly, if the voltages of the solar cell strings involve only a difference of that of one solar cell module or so, the IV mismatch loss is suppressed to a very low level, which is very preferable. When the solar cell array is constructed using the solar cell strings allowed to have the difference of one module in the number of series solar cell modules, the array can also be constructed with an installation number of solar cell modules that were considered before to be incapable of constructing the array. The array can be constructed with virtually any installation number of solar cell modules, thus greatly increasing the degrees of freedom of design. This permits us to construct the solar cell arrays of almost all output capacities.

When there is the difference of one module in the number of series solar cell modules, there normally appears only one peak in the voltage-power characteristic curve of the solar cell array. Since one peak of the voltage-power characteristic curve is roughly approximated by a ratio of a large series number and a small series number, it may be used. The voltage-current characteristics may be combined and checked for various cases. They may also be preliminarily investigated to create a database.

Since there is no limitation on the number of solar cell modules installed from the array configuration, the solar cell modules can be installed in a form preferred in terms of the design. In the case of the building-material-incorporated solar cells such as the roof-material-incorporated solar cells, the solar cell modules can be installed all over the installation surface available solar cells, which is particularly preferred.

In a configuration wherein solar cell strings are composed of two or more types of solar cell modules having an identical rated current but different rated voltages, there is little power decrease even with some difference among string voltages, as described previously. The solar cell modules of different kinds can be installed even in an area that was incapable of being filled with one type of solar cell modules, and the output capacity of the solar cell array can thus be increased. It is also preferable in terms of the design, because the solar cell modules can be laid even in areas that were not filled with the solar cell modules before.

In another configuration wherein the solar cell strings on one mount plane are composed of the solar cell modules of the same kind and wherein the solar cell strings on at least one other mount plane are composed of the solar cell modules of a different kind from that of the solar cell modules on the foregoing mount plane, the solar cell modules can be selected so as to suit each mount plane, the output capacity of the solar cell array can be increased, and the solar cell modules of the same kind are commonly used for each mount plane, which is preferred in terms of the design.

In the case of the solar power generation apparatus to control the power converting means so as to maximize the output power of the solar cell array, the following arrangement is employed. Let us call a combination of the array with a solar cell string on a certain mount plane as a solar cell sub-array. When the rated voltage of the solar cell sub-array is different, the voltage to maximize the output power of the solar cell array also varies according to change in sunshine conditions (for example, change in the angle of incidence of sunshine during one day). By providing the power converting means with the so-called MPPT control to perform such control as to maximize the output power of the solar cell array, the maximum output can be always extracted from the solar cell array, following the changing maximum output operating voltages, and thus more power can be attained.

BRIEF DESCRIPTION OF THE DRAWINGS

FIGS. 6A and 6B are drawings each to show an example of the conventional solar cell array for comparison with the present invention;

FIG. 7 is another example of the conventional solar cell array for comparison with the present invention;

FIG. 19 is a drawing to show an example of the solar cell array using the conventional solar cell array; and FIG. 20 is a drawing to explain the relation between voltage deviation amounts between strings, and decrease in power.

DESCRIPTION OF THE PREFERRED EMBODIMENTS

The embodiments of the present invention will be described by reference to the drawings.

(Embodiment 1)

Figure 1:
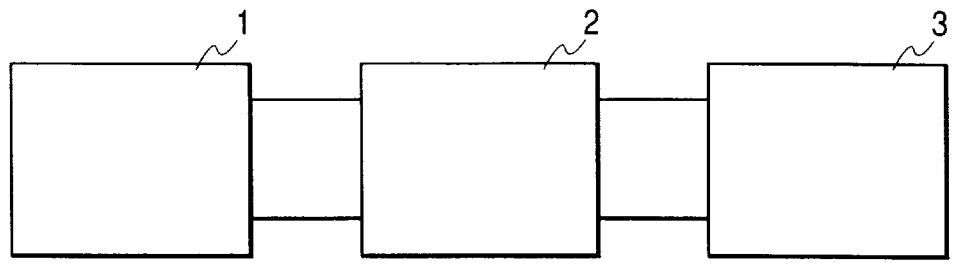
FIG. 1 is a drawing to show the schematic structure of a solar power generation apparatus using the solar cell array of the present invention.

FIG. 1 shows an example of the configuration of the solar power generation apparatus to which the present invention is applied.

The solar cell array 1 is constructed by connecting the solar cell modules in series so as to obtain a desired voltage, thereby forming solar cell strings, and connecting the solar cell strings in parallel so as to obtain a desired output capacity, thus composing the solar cell array 1. Kinds of the cells for the solar cell modules are, for example, those using amorphous silicon, microcrystalline silicon, polycrystal silicon, single-crystal silicon, or compound semiconductors. There are various types of solar cell modules, including the roof-material-incorporated types, such as the batten seam roofing type or the horizontal roofing type, and the conventional type provided with an aluminum frame.

The output power from the solar cell array 1 is supplied through power converting unit 2 to load 3. The power converting unit 2 is selected from DC/DC converters using a self-turn-off switching device such as a power transistor, a power MOSFET, an IGBT, or a GTO, and self-excited DC/AC inverters. This power converting unit 2 can control the power flow, I/O voltage, output frequency, or the like by controlling on/off of gate pulse.

Examples of the load 3 include a heat load, a motor load, or the commercial alternating current system, and combinations thereof.

Next, the configuration of the solar cell array of the present invention will be described referring to FIG. 2.

Figure 2:
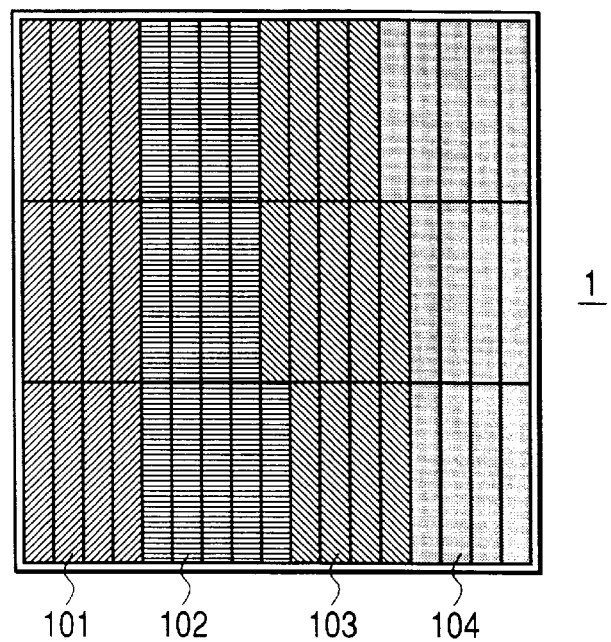
FIG. 2 is a drawing to show an example of the solar cell array using the solar cell array of the present invention.

FIG. 2 shows the same solar cell installation area as that shown in FIG. 6A and 6B showing the conventional array, in which 51 roof-material-incorporated amorphous silicon solar cell modules BS-03 available from CANON Inc. can be installed. When the power converting unit used is the system interconnection inverter SI-01 or SI-02 available from CANON Inc., the selectable number of series solar cell modules is in the range of 9 to 15 from the input voltage range of the inverter and the voltage of the solar cell modules.

The solar cell array 1 is composed of four solar cell strings, wherein the solar cell string 101 is composed of 12 solar cell modules connected in series and each of the solar cell strings 102, 103, 104 is composed of 13 solar cell modules connected in series. It is a matter of course that the numbers of series solar cell modules are within the aforementioned selectable range.

Figure 3:
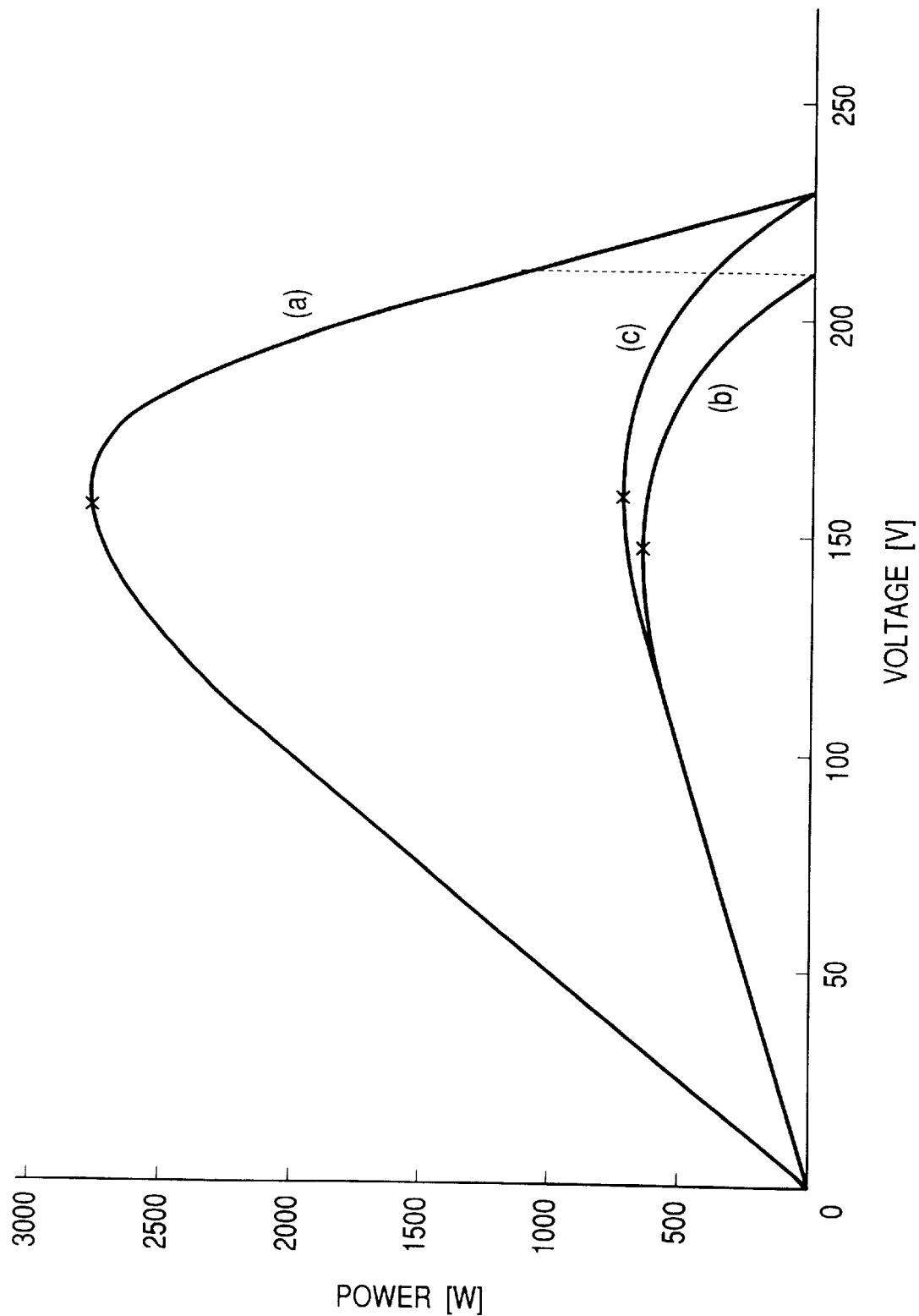
FIG. 3 is an example of the voltage-power characteristic of the solar cell array of the present invention.

FIG. 3 shows the voltage-power characteristics of each solar cell string and the solar cell array, in which the abscissa indicates the voltage and the ordinate the power. In the drawing (b) indicates the voltage-power characteristic of the solar cell string of 12 series solar cell modules, (c) that of the solar cell strings of 13 series solar cell modules, and (a) that of the solar cell array composed of one solar cell string of 12 series modules and three solar cell strings of 13 series modules, connected in parallel. The optimum operating voltage of the solar cell array is between those of the solar cell string of 12 series and the solar cell strings of 13 series, and the position thereof is approximately the inverse of a ratio of the numbers of the solar cell strings of 12 series and 13 series. There is only one power peak.

Checking the output power under certain sunshine conditions and temperature, the solar cell array of this configuration shows an output power of 2739 W. The IV mismatch loss at this time is 0.44% and is thus suppressed to a very low level. When 50 solar cell modules are installed in the conventional array configuration of 10 series×5 parallel, the output thereof under the same conditions is 2697 W. The output of the present array configuration under the above conditions is thus increased by 42 W from that of the conventional array. When 48 solar cell modules are installed in another conventional array configuration of 12 series×4 parallel, the output thereof under the same conditions is 2589 W. The output of the present array configuration is thus increased by 150 W from that of the conventional array.

As described, the solar cell modules can be installed over the entire surface of the possible installation area while well suppressing the IV mismatch loss in the configuration of solar cell array. This can increase the output capacity of the solar cell array and increase the power supply from the solar cells. In addition, the solar cells can be installed over the entire surface and any dummy module does not have to be installed, which is preferred in terms of the design. It is very preferable in terms of the design, particularly, in the case of the roof-material-incorporated solar cell modules being used. The IV mismatch loss is well suppressed by the configuration in which only one series is different in the number of series solar cell modules constituting the solar cell string from the other strings. Further, the IV mismatch loss can be suppressed very well by use of the amorphous silicon solar cells.

(Embodiment 2)

Figure 4:
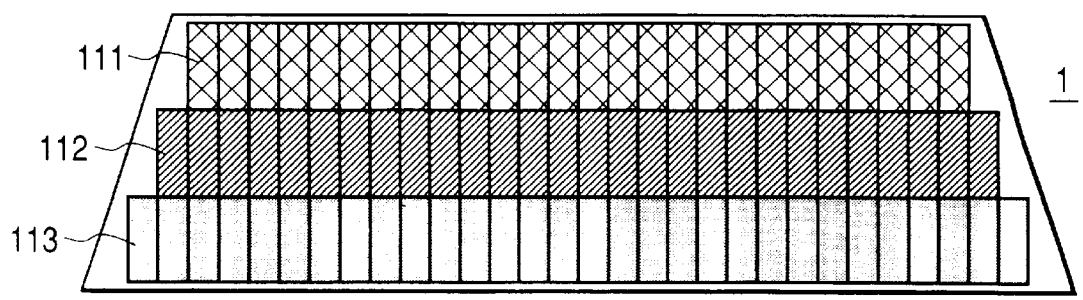
FIG. 4 is another example of the solar cell array using the solar cell array of the present invention.

FIG. 4 shows an example of installation of solar cell modules using the solar cell array of the present invention. This is an example in which the shape of mount plane is a trapezoid as in a hipped roof or the like. In this example, 84 roof-material-incorporated amorphous silicon solar cell modules BS-04 available from CANON Inc. can be installed on the mount plane as illustrated. The system interconnection inverter used is SI-01 or SI-02 available from CANON Inc. The selectable number of series solar cell modules is in the range of 18 to 30 from the input voltage range of the inverter and the voltage of the solar cell modules. The solar cell array to which the present invention is applied in this condition is composed of three parallel strings; solar cell string 111 composed of 26 solar cell modules connected in series, solar cell string 112 composed of 28 solar cell modules connected in series, and solar cell string 113 composed of 30 solar cell modules connected in series.

Figure 5:
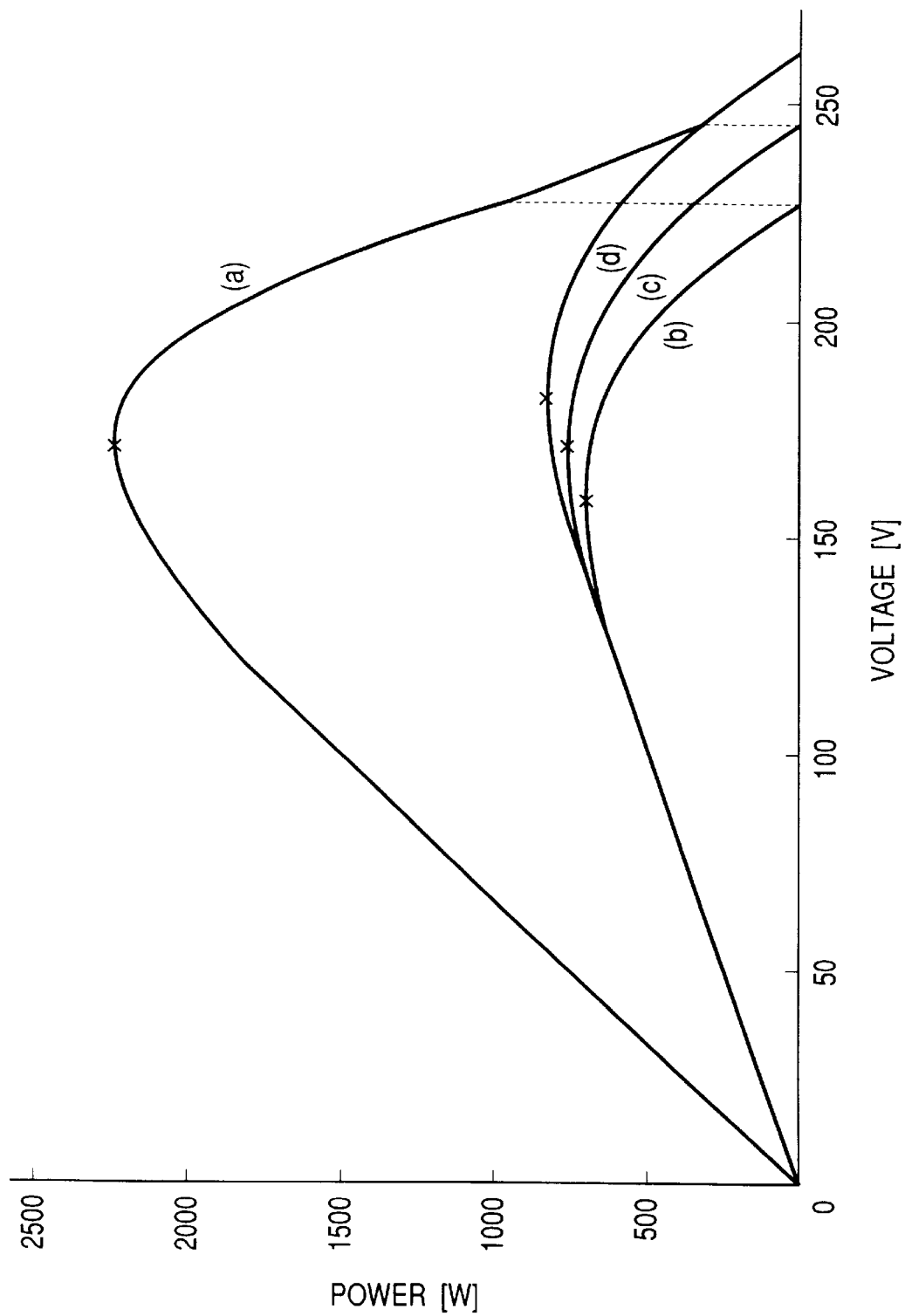
FIG. 5 is another example of the voltage-power characteristic of the solar cell array of the present invention.

FIG. 5 shows the voltage-power characteristics of the solar cell array and each solar cell string under certain sunshine conditions and temperature. The abscissa indicates the voltage and the ordinate the power. In the drawing (a) indicates the voltage-power characteristic of the solar cell array constructed in this embodiment, (b) that of the solar cell string 111 of 13 series solar cell modules, (c) that of the solar cell string 112 of 14 series solar cell modules, and (d) that of the solar cell string 113 of 15 series solar cell modules. The output of the array under the conditions was 2239 W. On the other hand, when three solar cell strings 171, 172, 173 each composed of 28 series solar cell modules are connected in parallel in the conventional array configuration as shown in FIG. 7, the power under the same conditions is 2265 W. Therefore, the IV mismatch loss is 1.15%, and the power decrease due to deviation in matching of output characteristic is suppressed in the level where no problem arises in practical use.

The output terminals of each solar cell string were located across the border to the next row in the conventional array as shown in FIG. 7. In the case of the array configuration of the present embodiment, each solar cell string can be located on a straight, horizontal line, so that the output terminals are located at the both ends on the left and right sides. This makes wiring very easy to find and also makes the installation work easier.

By the configuration wherein the series numbers of the respective solar cell strings are set to n, n+m, . . . , n+Am according to the shape of mount plane as described, the output terminals of each solar cell string can be located at the ends, the wiring becomes very easy to find, and the installation work becomes easier, while suppressing the IV mismatch loss. In addition, for example, even in the case wherein the solar cell array can be constructed of the installation number of solar cell modules in the configuration of A series×B parallel, the number of solar cell strings can be decreased by the configuration of different numbers of series solar cell modules according to the present invention. This produces the IV mismatch loss, but the wiring loss is decreased because of the decrease in the number of solar cell strings and the increase in the voltages of solar cell strings. Therefore, the total loss is decreased, thus enabling to construct an array configuration capable of obtaining a higher output. The decrease in the number of solar cell strings can decrease the use number of connection cables from the solar cell strings, thereby decreasing the cost for installation. Normally, junction boxes (DC collector boxes) for outputting the power of each solar cell string in parallel connection to the power converting unit are provided between the solar cells and the power converting unit, and the number of circuits of the junction boxes can also be decreased similarly and cheaper junction boxes can be used, thus decreasing the cost for installation.

(Embodiment 3)

Figure 8:
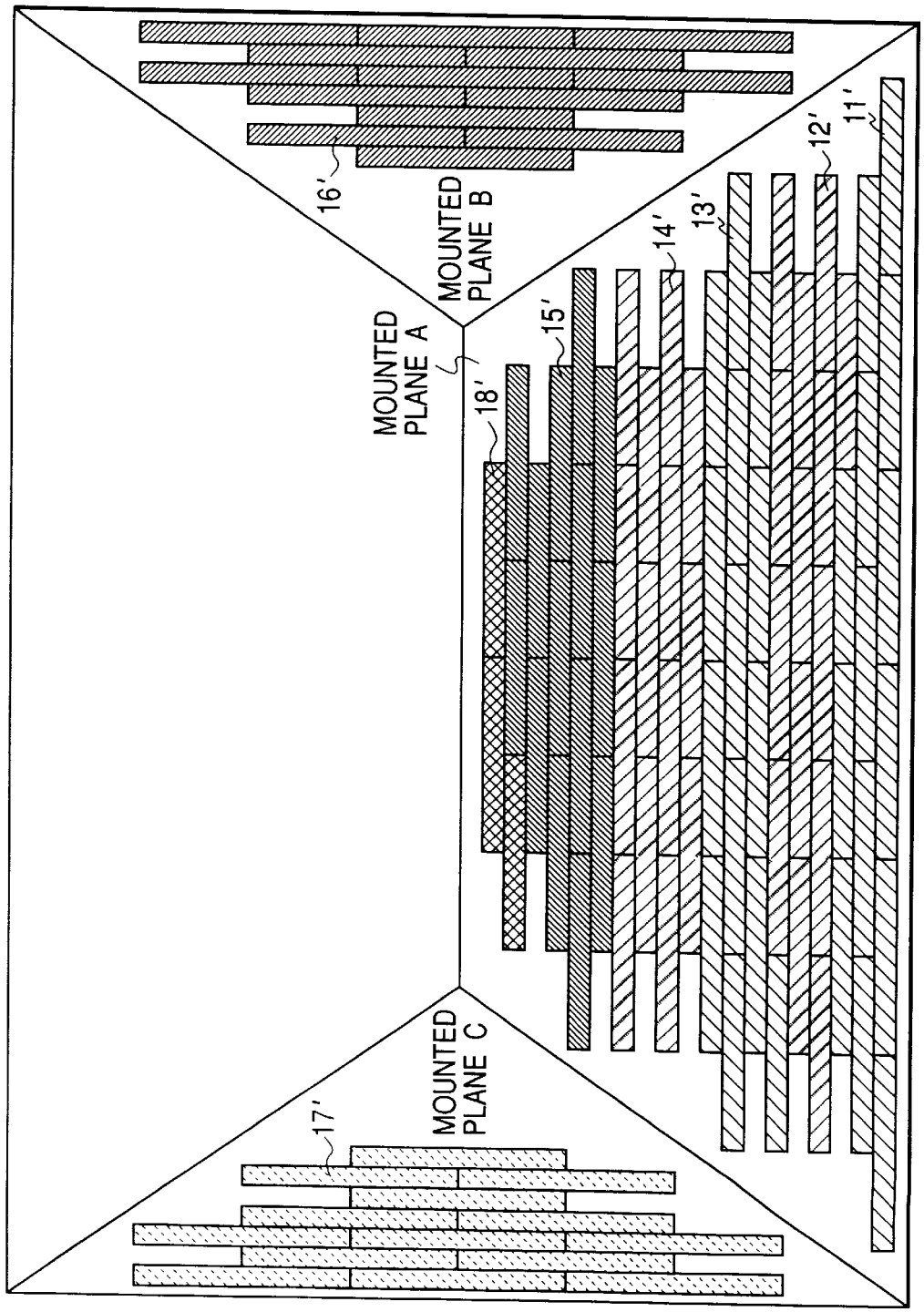
FIG. 8 is a drawing to show an example of the solar cell array using the conventional solar cell array.
Figure 9:
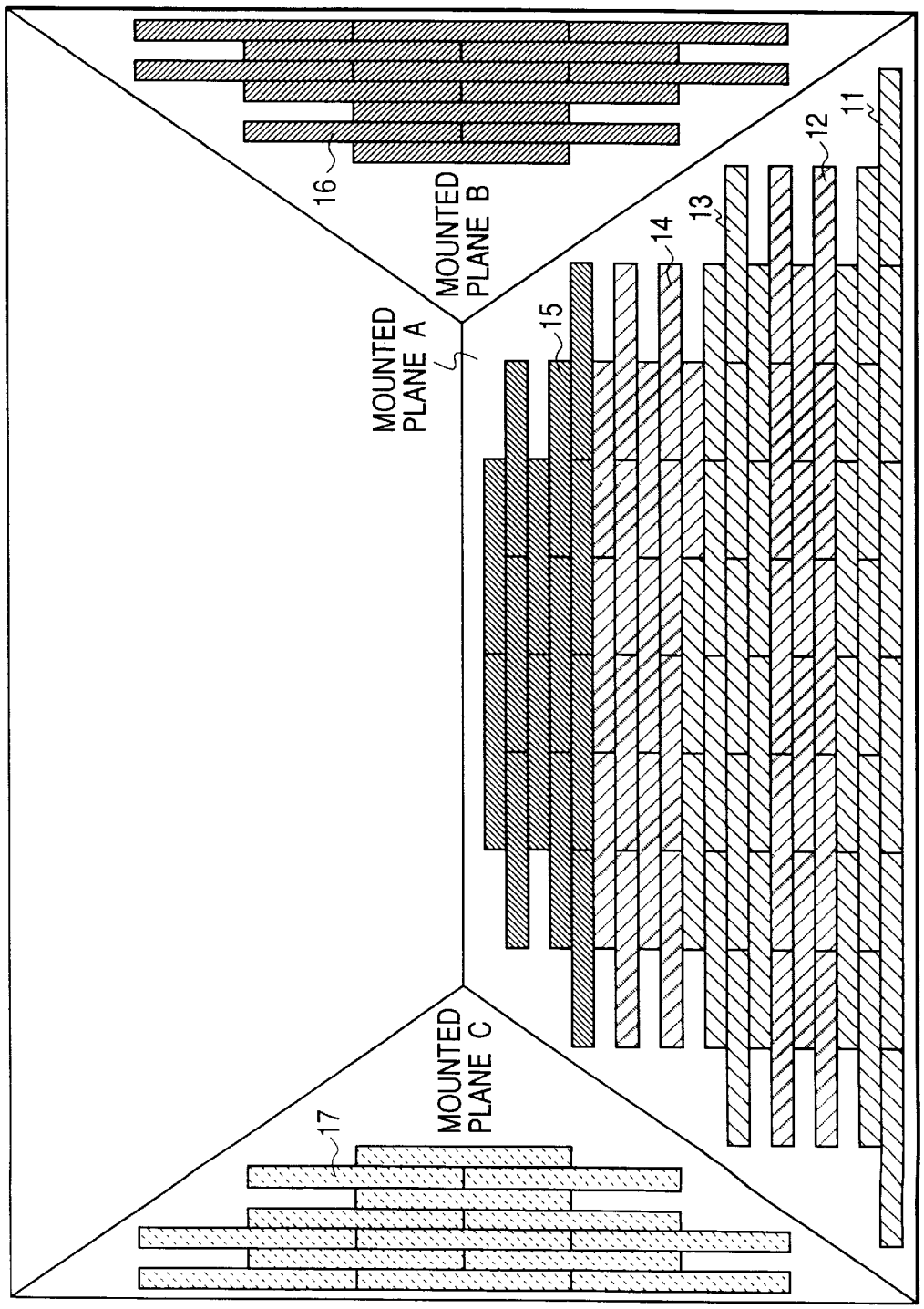
FIG. 9 is a drawing to show an example of the solar cell array using the solar cell array of the present invention.

FIG. 9 shows an example in which 73 roof-material-incorporated amorphous silicon solar cell modules SR-02 available from CANON Inc. are installed on the south surface and 14 modules on each of the east surface and the west surface in the same solar cell installation area as in the conventional example (2) (FIG. 8). Supposing the system interconnection inverter used is SI-04 available from CANON Inc., the selectable number of series solar cell modules is in the range of 10 to 20 from the input voltage range of the inverter and the voltage of the solar cell modules.

The solar cell array is composed of seven solar cell strings 11 to 17. The solar cell strings 11 to 15 are installed on the mount plane A of the south surface, the solar cell string 16 on the mount plane B of the east surface, and the solar cell string 17 on the mount plane C of the west surface. The number of the solar cell modules installed at this time is 101. Each of the solar cell strings 11 and 12 on the mount plane A is composed of 14 solar cell modules connected in series and each of the solar cell strings 13, 14, and 15 is composed of 15 solar cell modules connected in series. Each of the solar cell string 106 on the mount plane B and the solar cell string 17 on the mount plane C is composed of 14 solar cell modules connected in series. Of course, the numbers of series solar cell modules are within the aforementioned selectable range.

Figure 10:
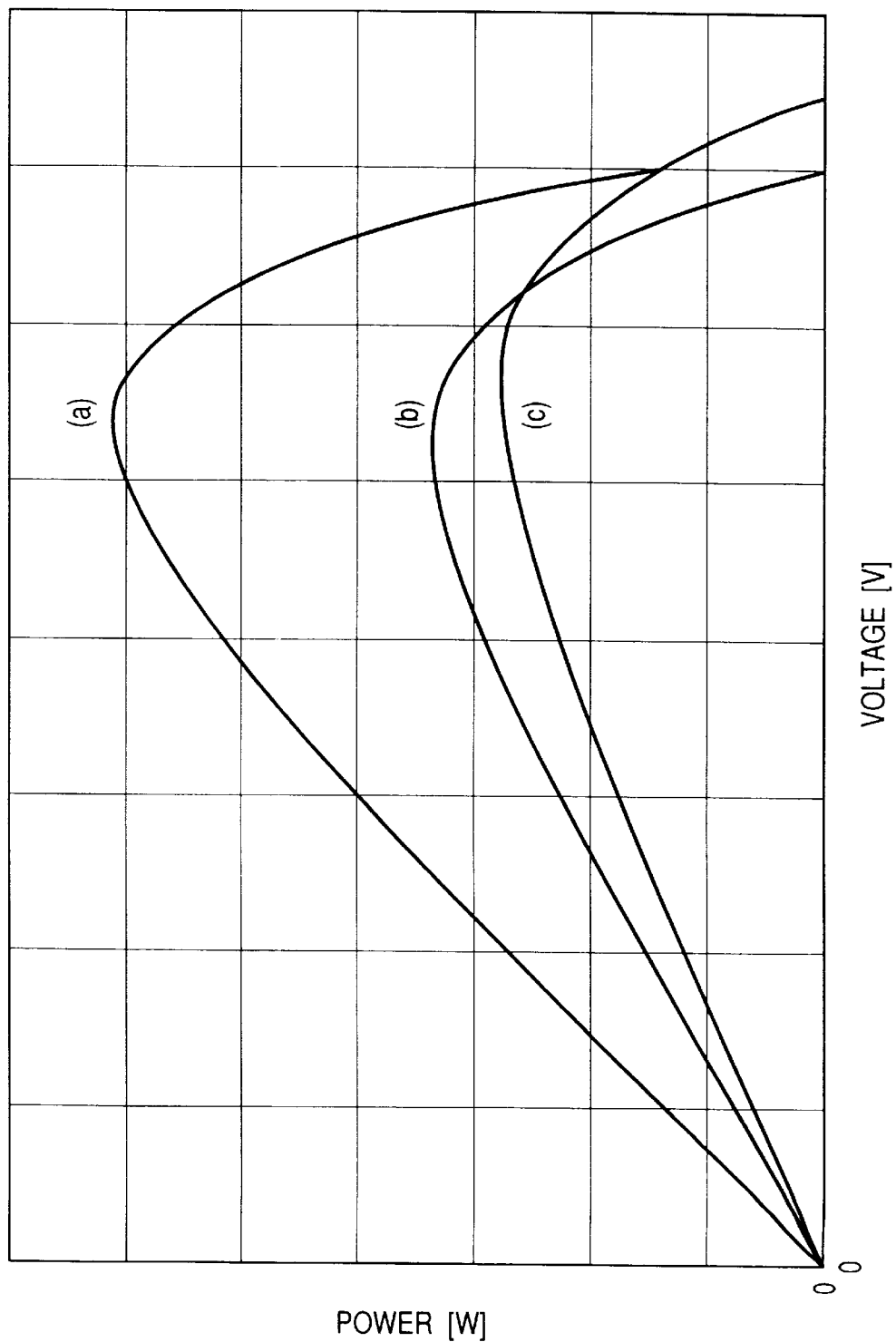
FIG. 10 is an example of the voltage-power characteristic of the solar cell array of the present invention.

FIG. 10 shows the voltage-power characteristics of each solar cell string and the solar cell array under certain sunshine conditions, wherein the abscissa indicates the voltage and the ordinate the power. In the drawing (b) shows the voltage-power characteristic of the combination of the solar cell strings of 14 series solar cell modules, (c) that of the combination of the solar cell strings of 15 series solar cell modules, and (a) that of the solar cell array composed of the 14 series solar cell strings and the 15 series solar cell strings connected in parallel.

The sunshine conditions are different among the mount planes A, B, and C and the solar cell strings demonstrate their output characteristics according to the respective sunshine conditions. Thus, the output characteristic is as shown in (b) of FIG. 10 for the combination of the solar cell strings 11 and 12 each of 14 series solar cell modules on the mount plane A, the solar cell string 16 on the mount plane B, and the solar cell string 17 on the mount plane C. Further, the output characteristic is as shown in (c) of FIG. 10 for the combination of the solar cell strings 13, 14, and 15 each of 15 series solar cell modules on the mount plane A.

The maximum output of the solar cell array at this time is 2473 W. The IV mismatch loss at this time is 0.46% and is thus suppressed in the very low level. This loss is very smaller than the other device losses, for example, than a loss due to contamination on the surface of solar cell module (which is considered to be 3% to 10%), and is in the level where substantially no problem arises. When 98 solar cell modules are installed in the conventional array configuration of 14 series×7 parallel (including the vacant areas 151 of three modules), the output under the same conditions is 2410 W. Therefore, under the above conditions, the output of the present array configuration is increased by 63 W from that of the conventional array and the percentage of the increase is 2.61%.

By the configuration wherein the solar cell array installed on the plural mount planes is composed of the solar cell strings not crossing the border between the mount planes and in the combination of two or more numbers of series solar cell modules in the solar cell strings, the solar cell modules can be installed over the entire surface of the possible installation area while well suppressing the IV mismatch loss in the configuration of solar cell array. This can increase the output capacity of the solar cell array and increase the power supply from the solar cells. In addition, the solar cells can be installed over the entire surface and no dummy module has to be installed, which is preferred in terms of the design. Particularly, the configuration is very preferable in terms of the design for the roof-material-incorporated solar cell modules. The IV mismatch loss is well suppressed by the configuration in which only one series is different in the number of series solar cell modules constituting each solar cell string. Further, the IV mismatch loss is suppressed very well by use of the amorphous silicon solar cells.

(Embodiment 4)

Figure 11:
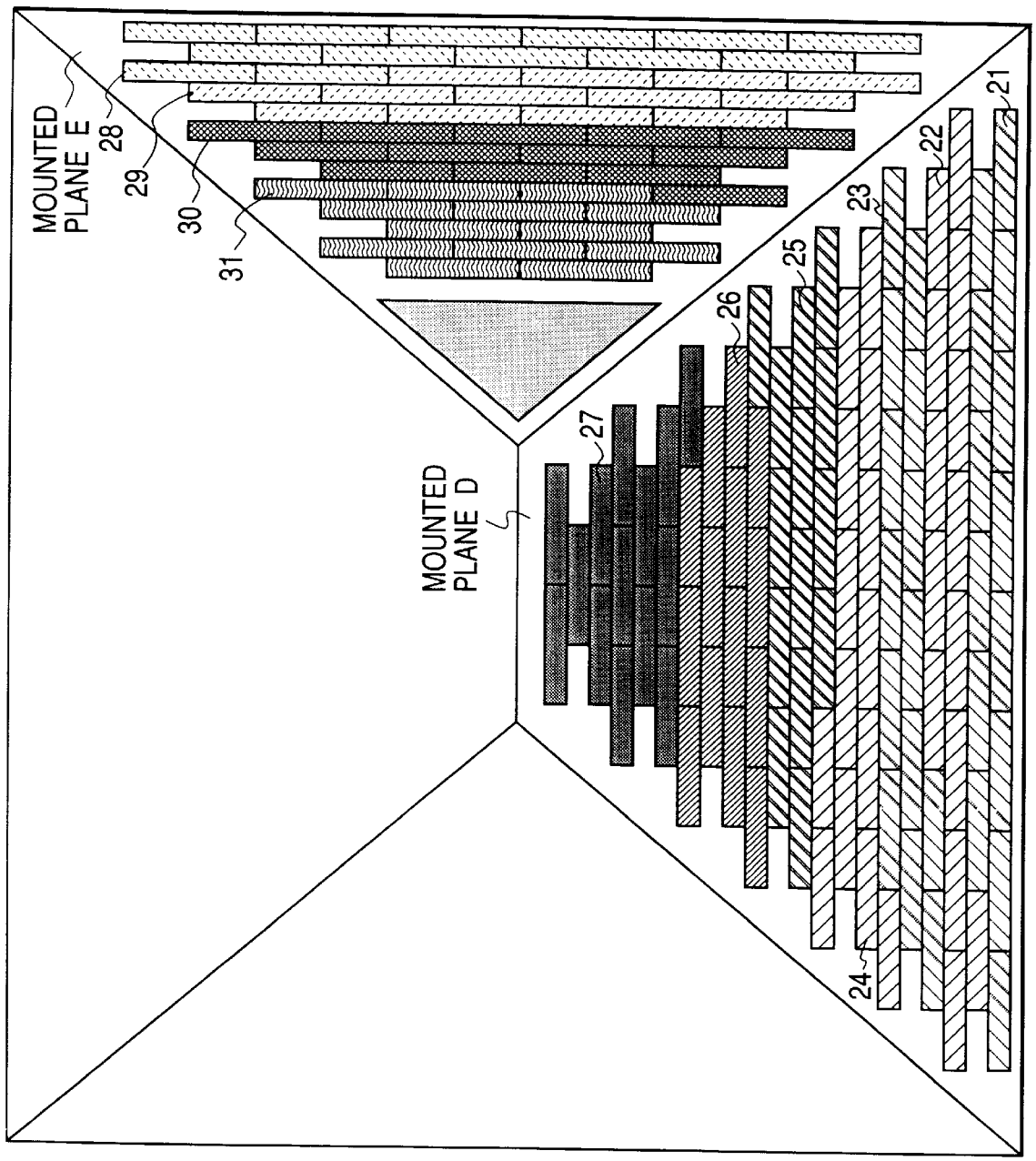
FIG. 11 is a drawing to show an example of the solar cell array using the solar cell array of the present invention.

FIG. 11 shows an example of installation of the solar cell modules using the solar cell array of the present invention. In this example, 150 roof-material-incorporated amorphous silicon solar cell modules SR-03 available from CANON Inc. can be installed on the mount planes as illustrated. The system interconnection inverter used is SI-04 available from CANON Inc. The selectable number of series solar cell modules is in the range of 13 to 27 from the input voltage range of the inverter and the voltage of the solar cell modules. The following solar cell array is constructed in this condition by applying the present invention. Solar cell strings 21, 22, 23, 24, 25, 26, and 27 each of 14 series solar cell modules are installed on the mount plane D of the south surface. Solar cell strings 28, 29, 30, and 31 each of 13 series solar cell modules are placed on the mount plane E of the east surface.

Figure 12:
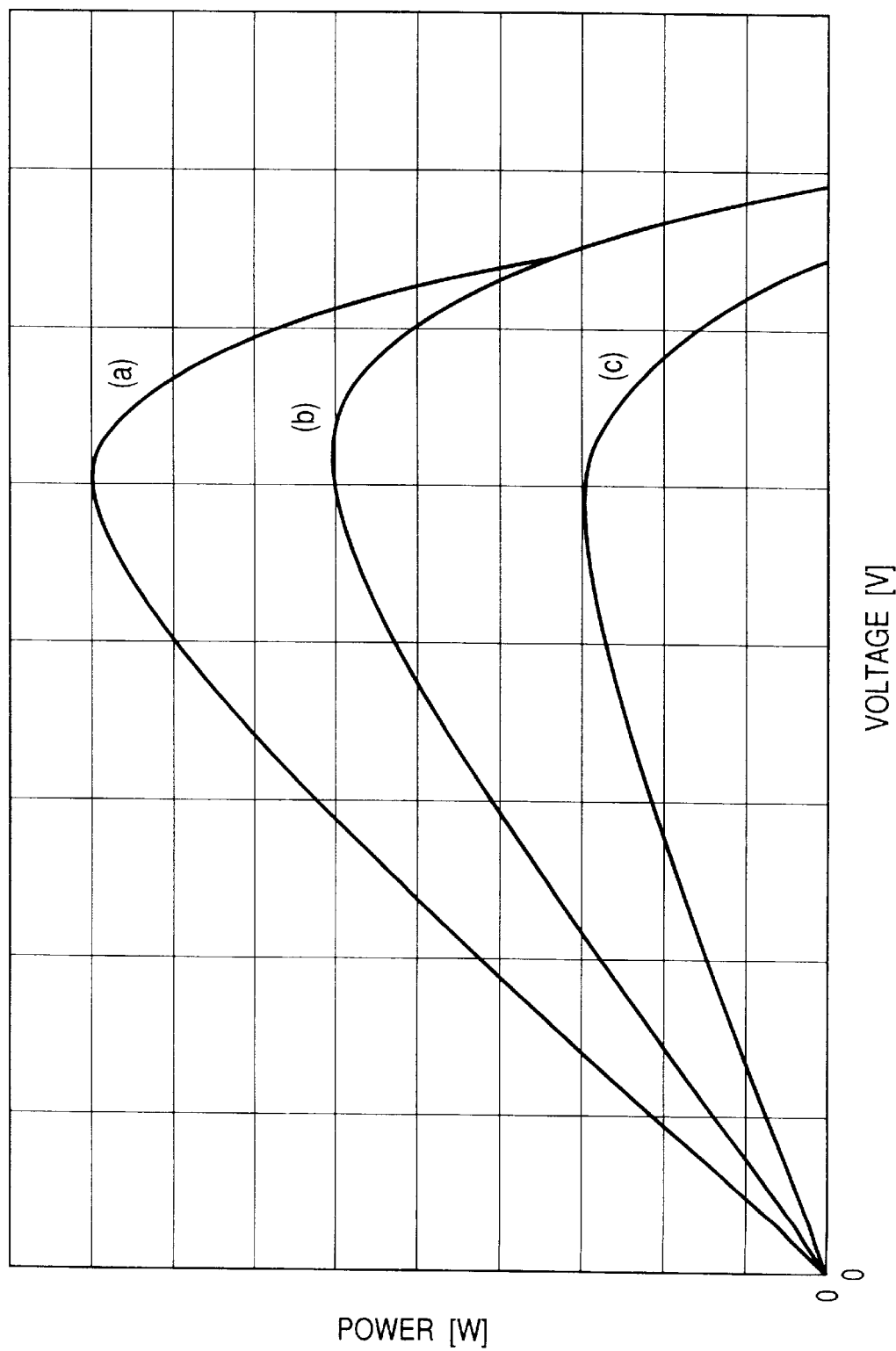
FIG. 12 is an example of the voltage-power characteristic of the solar cell array of the present invention.

FIG. 12 shows the voltage-power characteristics of the solar cell array and each solar cell string under certain sunshine conditions. The abscissa indicates the voltage and the ordinate the power. In the figure (b) represents the voltage-power characteristic of the combination of the solar cell strings 21 to 27 of 14 series solar cell modules, (c) that of the combination of the solar cell strings 28 to 31 of 13 series solar cell modules, and (a) that of the entire solar cell array. The output of the array at this time was 2760 W.

Figure 13:
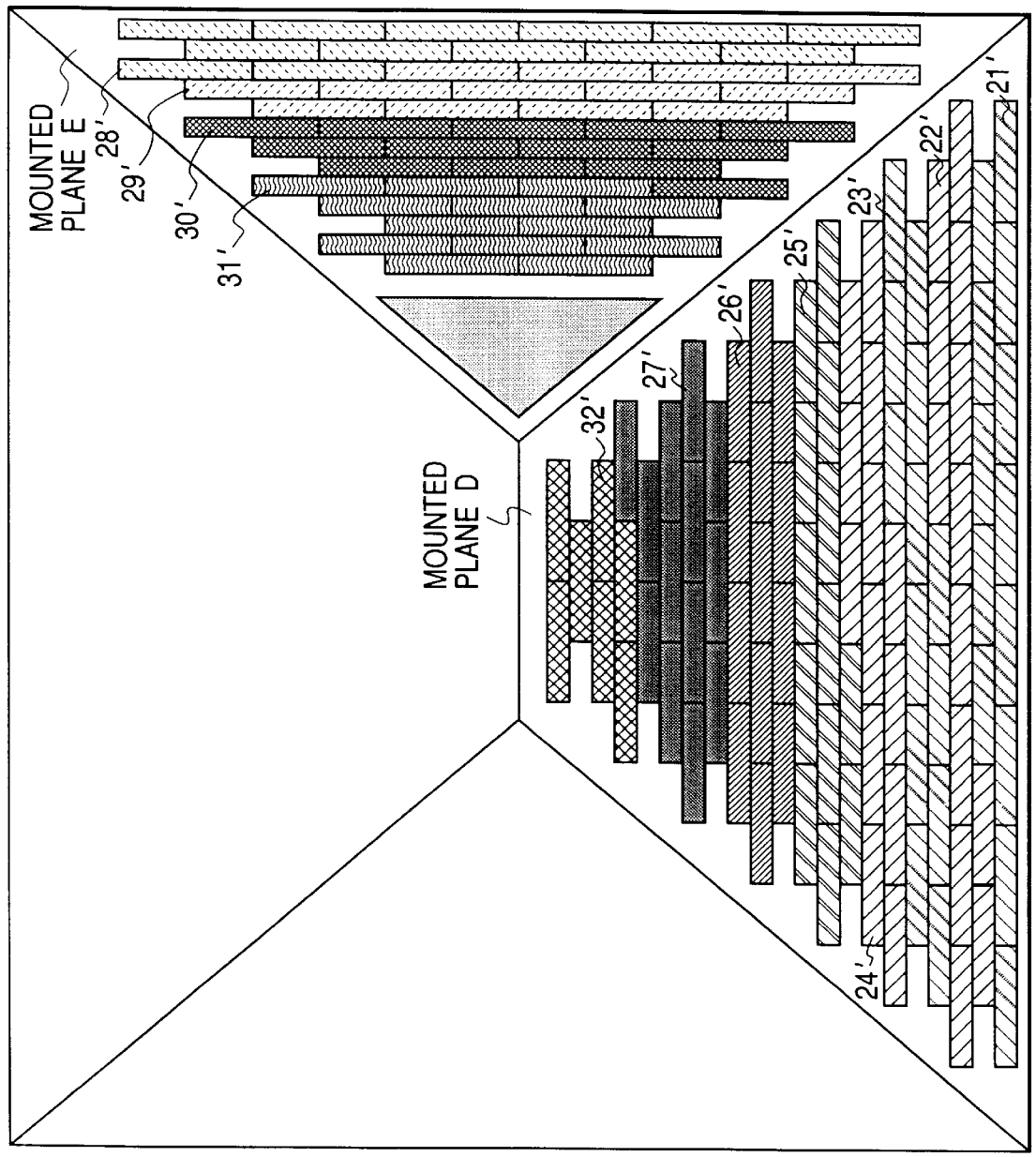
FIG. 13 is a drawing to show an example of the solar cell array using the conventional solar cell array.

On the other hand, when 11 solar cell strings 21' to 31' of 13 series solar cell modules are connected in parallel in the conventional array configuration as shown in FIG. 13 (forming vacant areas 32 of six modules), the output is 2642 W under the same conditions. Under the above conditions the output of the present array configuration is increased by 118 W and the percentage of the increase is 4.46% as compared with the conventional array. The IV mismatch loss is 0.53%, and the power decrease due to the deviation in matching of output characteristic is considerably smaller than the other device losses and is thus suppressed in the level where no problem arises in practical use.

The rated voltages of the respective solar cell strings are arranged to be equal on each single mount plane. This allows a common reference value to be used for the solar cell strings on each single mount plane in checking the voltage in order to confirm connection and output upon the installation work. This facilitates judgment of whether good or not. This also facilitates the installation work.

By the configuration wherein the rated voltages of the solar cell strings are set equal on each single mount plane and the rated voltages are different between the mount planes as described, the IV mismatch loss is suppressed, the output power is increased, the confirmation work is carried out without an error, and the installation work is facilitated.

It is also conceivable that when the solar cell array is installed on the south surface and the north surface, the rated voltages of the respective solar cell strings are set equal on each single mount plane as described above and the rated voltage of the south surface is a little higher, for example, higher by one module than that of the north surface. When this configuration is employed, there are some cases where the IV mismatch loss is further suppressed when the temperature of the south surface becomes higher than that of the north surface so as to decrease the maximum output operating voltage, thereby decreasing the actual difference between the maximum output operating voltages.

(Embodiment 5)

Figure 14:
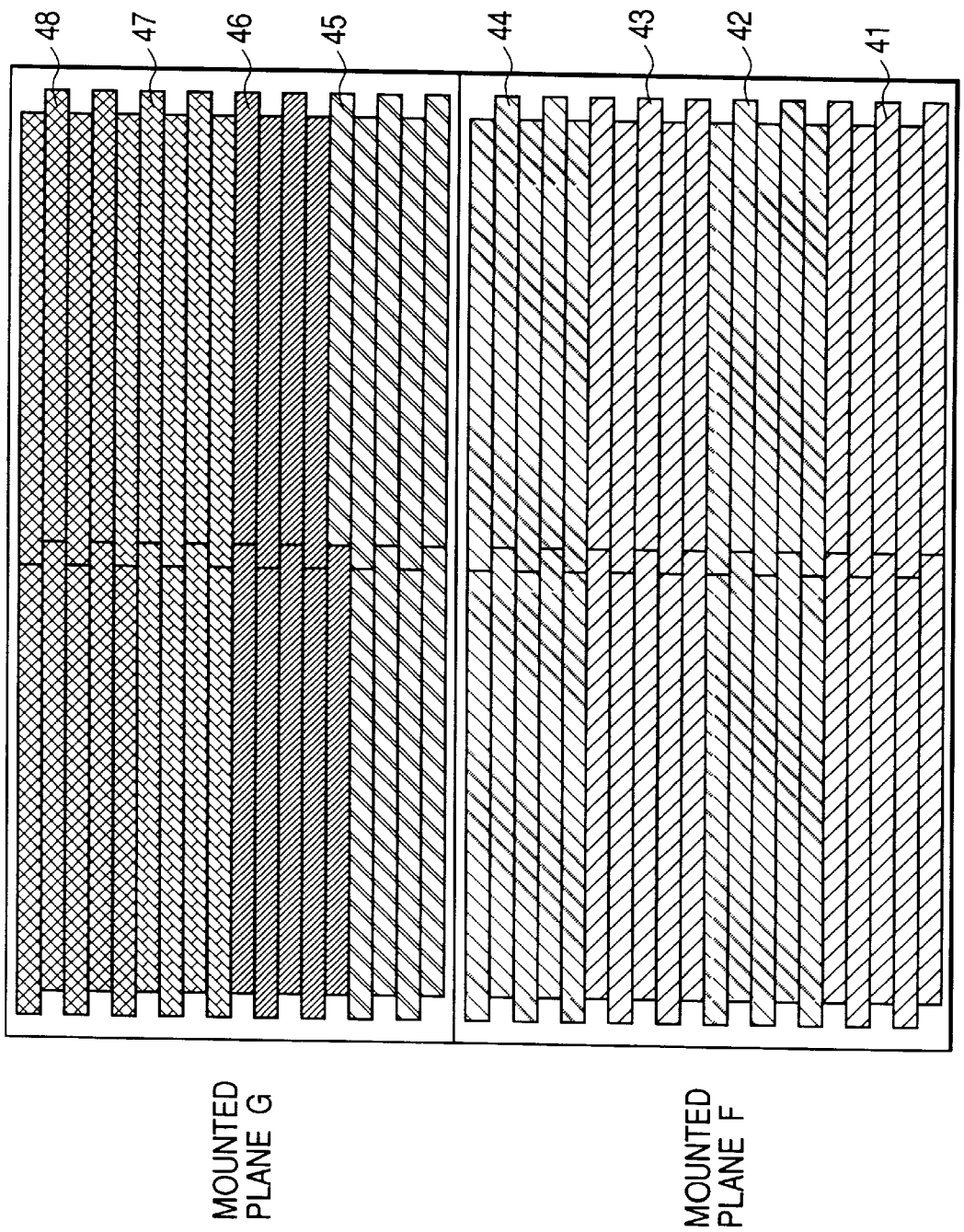
FIG. 14 is a drawing to show an example of the solar cell array using the solar cell array of the present invention.

FIG. 14 shows an example (a gable roof) of installation of the solar cell modules using the solar cell array of the present invention. In this example 76 roof-material-incorporated amorphous silicon solar cell modules SR-01 available from CANON Inc. can be installed on the mount planes as illustrated. The system interconnection inverter used is SI-04 available from CANON Inc. The selectable number of series solar cell modules is in the range of 5 to 10 from the input voltage range of the inverter and the voltage of the solar cell modules. The following solar cell array is constructed in this condition by applying the present invention. Solar cell strings 41, 42, 43, and 44 each of 10 series solar cell modules are installed on the mount plane F of the east surface. Solar cell strings 45, 46, 47, and 48 each of 9 series solar cell modules are installed on the mount plane G of the west surface.

Figure 15:
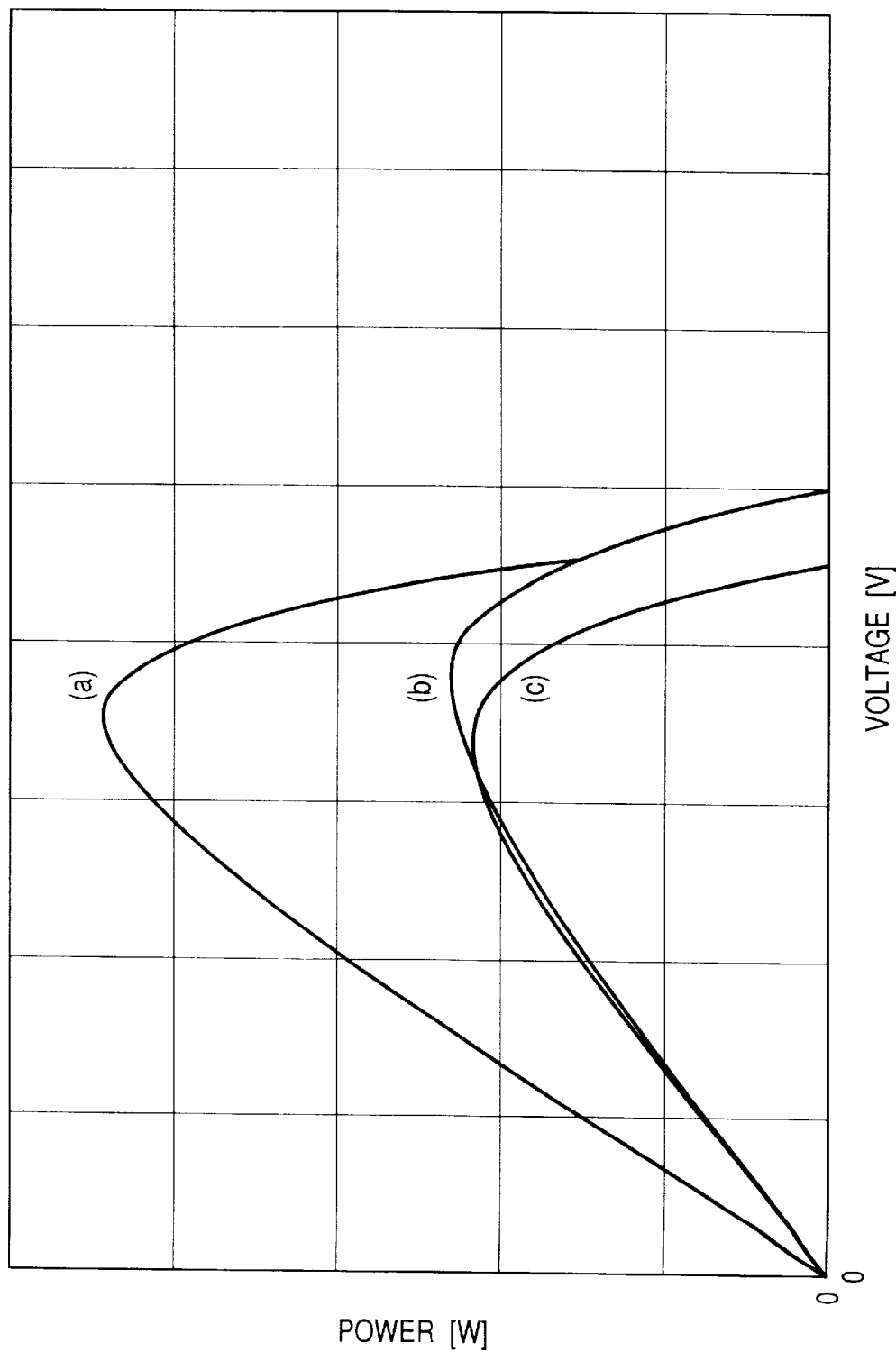
FIG. 15 is an example of the voltage-power characteristic of the solar cell array of the present invention.

FIG. 15 shows the voltage-power characteristics of the solar cell array and each solar cell string under certain sunshine conditions. The abscissa indicates the voltage and the ordinate the power. In the figure (b) represents the voltage-power characteristic of the combination of the solar cell strings 41 to 44 of 10 series solar cell modules, (c) that of the combination of the solar cell strings 45 to 48 of 9 series solar cell modules, and (a) that of the entire solar cell array. The output of the array at this time was 3649 W.

Figure 16:
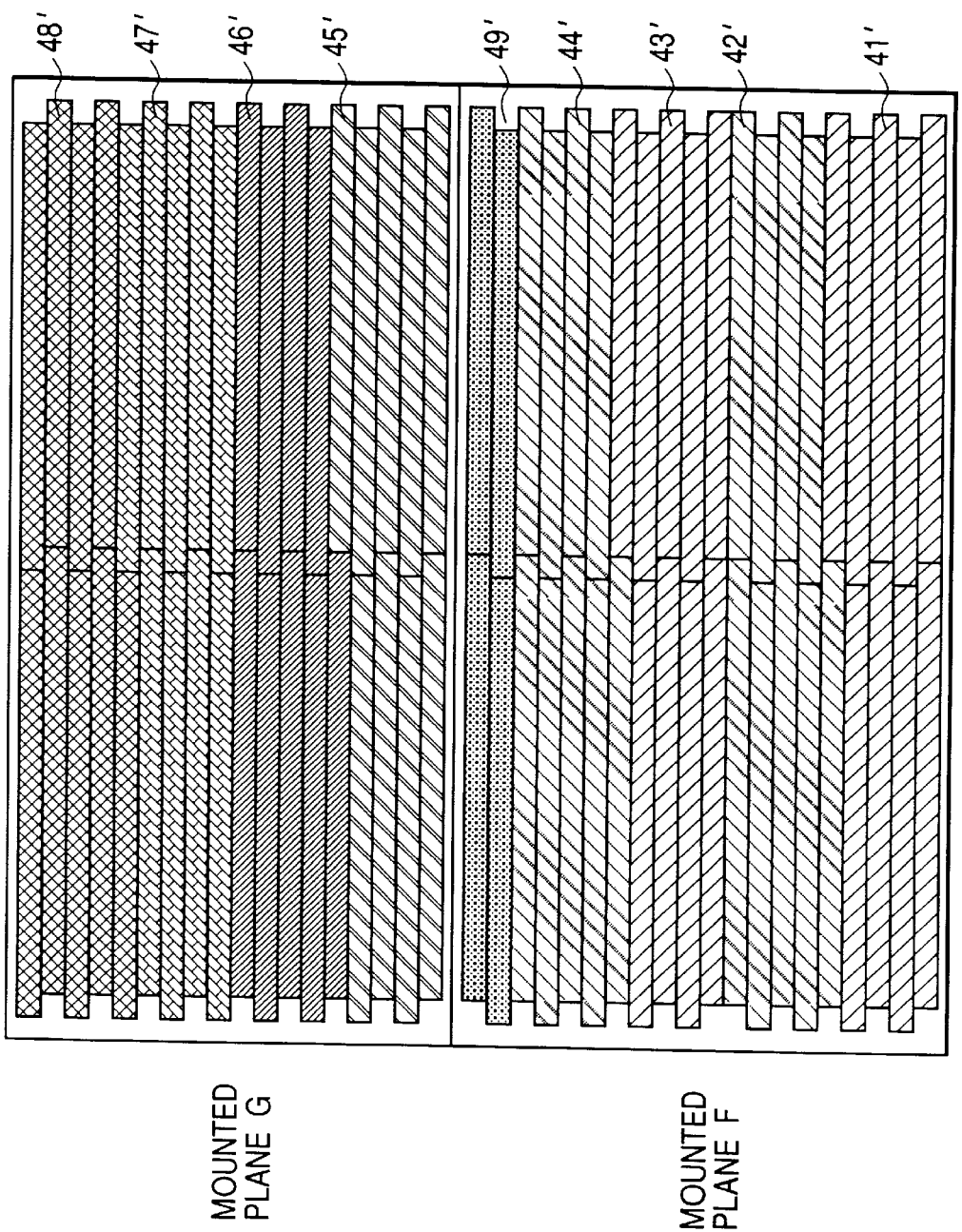
FIG. 16 is a drawing to show an example of the solar cell array using the conventional solar cell array.

On the other hand, when 11 solar cell strings (41' to 48') each of 13 series solar cell modules are connected in parallel in the conventional array configuration as shown in FIG. 16 (forming vacant areas 49 of four modules), the output is 3499 W under the same conditions. Under the above conditions the output of the present array configuration is increased by 150 W and the percentage of the increase is 4.29% as compared with the conventional array. The IV mismatch loss is 1.1%, and the power decrease due to the deviation in matching of output characteristic is considerably smaller than the other device losses and is thus suppressed in the level where no problem arises in practical use.

In the installation example of the present embodiment, quantities of solar radiation on the east surface (mount plane F) and on the west surface (mount plane G) greatly differ between in the morning and in the evening. In the morning quantities of power generation are great on the east surface, so that the maximum output operating voltage of the array approaches the maximum output operating voltage of the solar cell strings on the east surface. In the evening quantities of power generation become great on the west surface, so that the maximum output operating voltage of the array approaches the maximum output operating voltage of the solar cell strings on the west surface. In this way the maximum output operating voltage of the solar cell array varies depending upon the difference in ratios of power generation quantities on the east surface and on the west surface. Also, from this point of view, the power converting unit is preferably equipped with the so-called MPPT control to control the operating point of the solar cell array so as to maximize the output of the solar cell array, whereby this configuration attains more power, which is more preferred.

(Embodiment 6)

Figure 17:
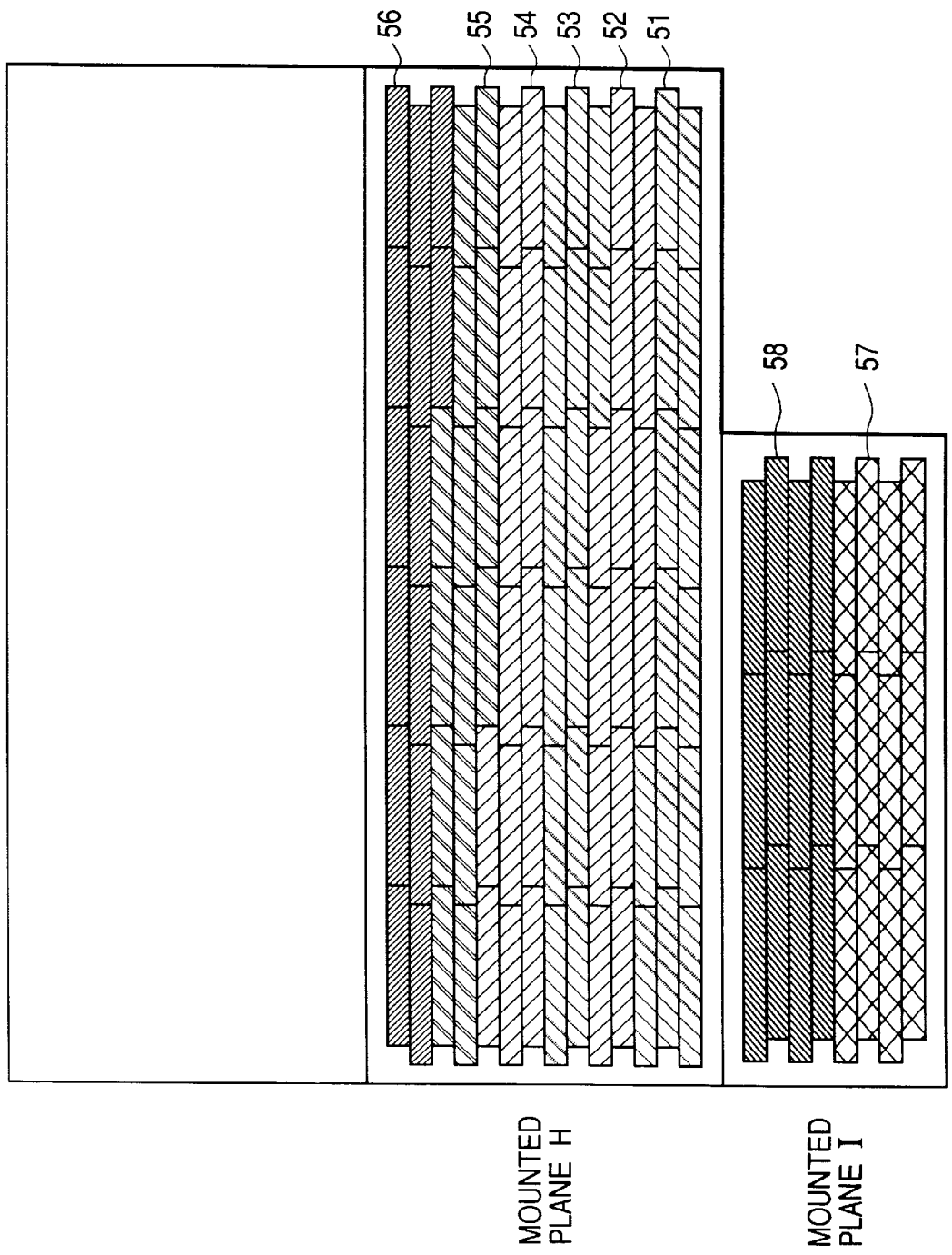
FIG. 17 is a drawing to show an example of the solar cell array using the solar cell array of the present invention.

FIG. 17 shows an example of installation of solar cell modules using the solar cell array of the present invention. In this example, 84 roof-material-incorporated amorphous silicon solar cell modules SR-02 available from CANON Inc. can be installed on mount plane H and 40 modules SR-03 on mount plane I as illustrated. The system interconnection inverter used is SI-04 available from CANON Inc. In the case of the modules SR-02 being used, the selectable number of series solar cell modules is in the range of 10 to 20 from the input voltage range of the inverter. In the case of the modules SR-03 being used, the selectable number of series solar cell modules is in the range of 13 to 27 from the input voltage range of the inverter. The following solar cell array is constructed in this condition by applying the present invention. The mount plane H and mount plane I are directed in the same direction and have respective angles of slope a little different from each other. Selected for each of the mount plane H and the mount plane I are the solar cell modules of a kind to maximize the output when the all solar cell modules of one kind are laid on each mount plane. The solar cell modules SR-02 are selected for the mount plane H and 14 modules are connected in series to form each of the solar cell strings 51, 52, 53, 54, 55, and 56. The solar cell modules SR-03 are selected for the mount plane I and 20 modules are connected in series to form each of the solar cell strings 57 and 58.

Figure 18:
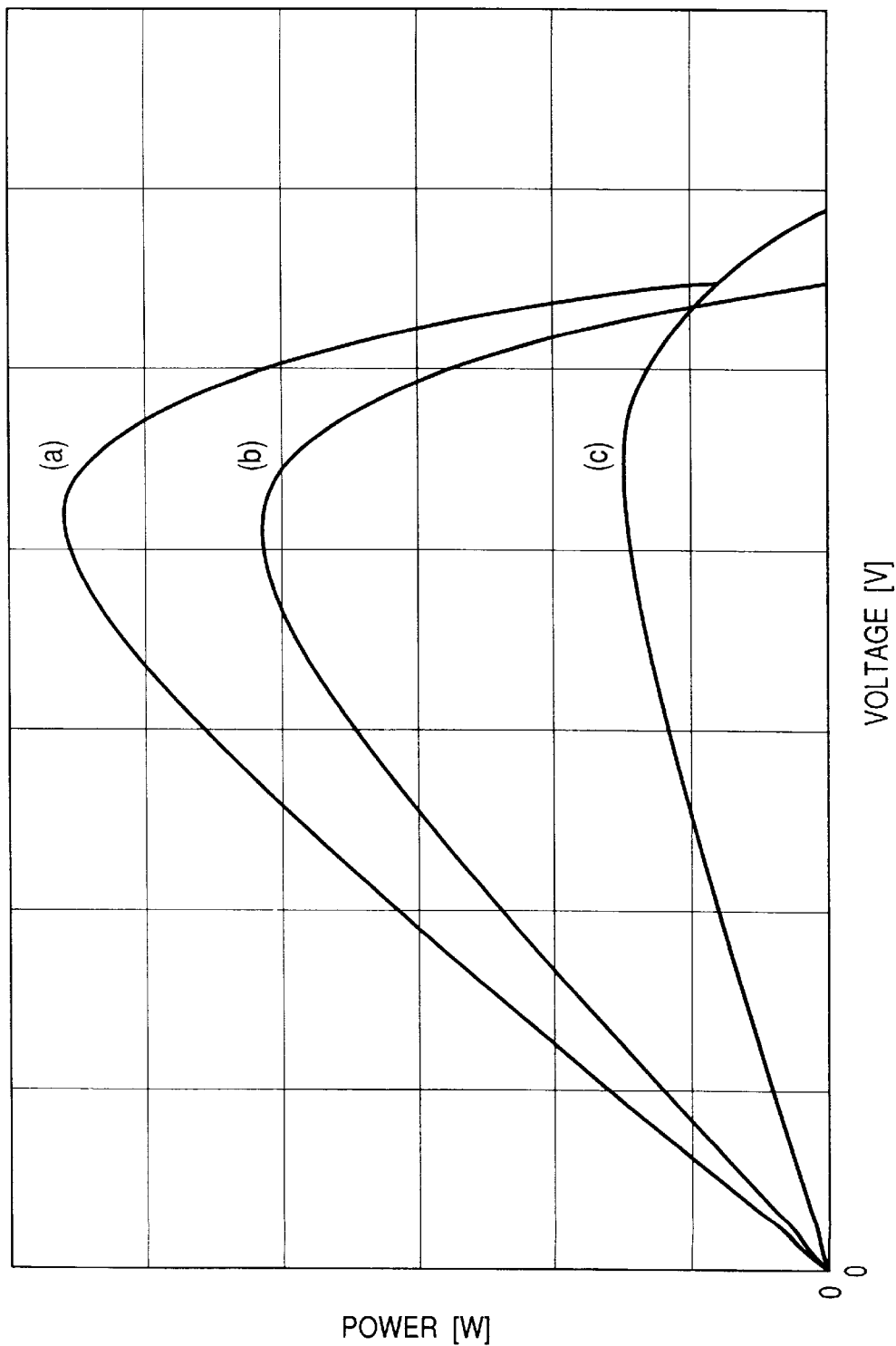
FIG. 18 is an example of the voltage-power characteristic of the solar cell array of the present invention.

FIG. 18 shows the voltage-power characteristics of the solar cell array and each solar cell string under certain sunshine conditions. The abscissa indicates the voltage and the ordinate the power. In the figure (b) represents the voltage-power characteristic of the combination of the solar cell strings 51 to 56 of 14 series solar cell modules SR-02, (c) that of the combination of the solar cell strings 57 to 58 of 20 series solar cell modules SR-03, and (a) that of the entire solar cell array. The output of the array at this time was 2831 W.

On the other hand, according to the conventional array configuration as shown in FIG. 19, the solar cell modules SR-02 are installed in the configuration of 12 series and 7 parallel (51' to 57') on the mount plane H and the solar cell modules SR-02 in the configuration of 12 series and 2 parallel (58', 59') on the mount plane I, thus composing the solar cell array in the configuration of 12 series and 9 parallel. It is noted that the left and right vacant areas on the mount plane I are wider than in the present embodiment. The output of this solar cell array is 2691 W under the same conditions. Under the above conditions the output of the present array configuration is increased by 140 W from that of the conventional array and the percentage of the increase is 5.20%. The IV mismatch loss is 0.34%, and it is very small when compared with the other device losses and is thus suppressed to a level where no problem arises in practical use.

Since each single mount plane is filled with the solar cell modules of the same kind, the exterior view of each single mount plane can maintain the sense of unity, thus being excellent in appearance.

By the configuration wherein each solar cell string is constructed of the solar cell modules not crossing the border between the planes, wherein two or more rated voltages of the solar cell strings are combined, wherein the solar cell modules of the same kind are selected for each single mount plane, and wherein the whole solar cell array is composed of the combination of two or more types of solar cell modules as described above, the output voltage is increased with suppressing the IV mismatch loss, and the exterior view of each single mount plane maintains the sense of unity, thus being excellent in appearance.

Although the above example is arranged to have the same rated voltage on each single mount plane, the configuration may also be arranged in such a way that the solar cell strings on each single mount plane have two or more rated voltages.

It should be noted that the embodiments described above are preferred examples to carry out the present invention and that the present invention is not limited to the above examples, but can involve various modifications within the range not departing from the spirit and scope of the present invention.

(Effects of the Invention)

As discussed above, the solar cell array of the present invention has the following effects.

(1) The array can be constructed in any numbers of solar cell modules, and the degrees of freedom of design are thus extremely high.

This allows the solar cells to be laid without a waste space over the entire surface of the place where the solar cells can be installed, whereby the output of the solar cell array can be increased.

(2) Since the solar cells are laid without any dummy module over the entire surface of the place where the solar cells can be installed, the solar cell array is excellent in respect of design consideration.

(3) When the array is constructed so that the numbers of series solar cell modules forming the respective solar cell strings are different by only one module, the IV mismatch loss can be suppressed to an extremely low level and the output can be higher.

(4) When the numbers of series solar cell modules are n, n+m, . . . , n+Am so as to match the shape of mount plane, the output terminals of each solar cell string can be located at the ends of the mount plane, which makes wiring easier to find and the wiring work easier to carry out.

(5) When the amorphous silicon solar cells are used, the IV mismatch loss can be decreased more, because the shape of the voltage-power characteristic thereof is gentle.

(6) With the building-material-incorporated solar cell modules, the solar cells can be installed so as to match the roof design or the like, and thus the array configuration is excellent in the design and the appearance.

(7) When the solar cell modules having the same rated current but different rated voltages are used, the modules can be installed even in areas of clearance that were incapable of being filled with the solar cells before, and thus more output can be obtained.

(8) When the solar cell modules of the same kind are selected for each single mount plane and the whole solar cell array is composed of the combination of two or more types of solar cell modules, the exterior view of each single mount plane can achieve the desired sense of unity, thus being excellent in appearance.

(9) When the power converting means includes the MPPT control, it can follow even variations in the maximum output operating voltage caused by variations in the output ratio of the rated voltages due to variations in solar radiation, whereby the power can be obtained efficiently.

As detailed above, the present invention is very useful and the effects of the invention are extremely great, particularly, in applications using the building-material-incorporated solar cell modules.

What is claimed is:

1. A solar cell array in which a plurality of solar cell strings are connected in parallel, at least one of said solar cell strings having a first rated voltage and another of said solar cell strings having a second rated voltage, said first and second voltages being unequal, wherein a voltage-power characteristic curve of said solar cell array has one power peak.

2. A solar cell array according to claim 1, wherein said solar cell do not all consist of the same number of solar cells connected in series.

3. A solar cell array according to claim 1, wherein said solar cell strings do not all consist of the same number of solar cell modules connected in series.

4. A solar cell array according to claim 3, wherein the solar cell strings n, (n+m), (n+2m), . . . , and (n+Am) (where n, m, and A are positive integers) solar cell modules connected in series.

5. A solar cell array according to claim 3, having a solar cell string wherein a number of series solar cell modules is n and a solar cell string wherein a number of series solar cell modules is (n+1), where n is a positive integer.

6. A solar cell array according to claim 1, wherein at least one of said solar cell strings has two or more types of solar cell modules having a same rated current but different rated voltages.

7. A solar cell array according to claim 1, wherein said plurality of solar cell strings are installed on a plurality of mount planes and each of the solar cell strings is installed on a single mount plane.

8. A solar cell array according to claim 7, wherein each of said plurality of solar cell strings is comprised of solar cell modules of a same type and the whole of the solar cell array has solar cell modules of two or more types.

9. A solar cell array according to claim 7, wherein plural solar cell strings installed on a single mount plane have an identical rated voltage and wherein said rated voltage is different from that of solar cell strings installed on another mount plane.

10. A solar cell array according to claim 1, wherein solar cells of said solar cell array are amorphous silicon solar cells.

11. A solar cell array according to claim 1, wherein solar cell modules forming said solar cell strings are building-material-incorporated solar cell modules.

12. A solar power generation apparatus comprising the solar cell array as set forth in any one of claims 1 and 2–11, and a power control device connected to said solar cell array.

13. A solar power generation apparatus according to claim 12, wherein said power control device performs such a control as to maximize output power of said solar cell array.

14. A solar cell array comprising a plurality of solar cell strings having different rated voltages and being connected in parallel, each of said solar cell strings comprising a plurality of solar cells, said solar cells being connected in series and being the same kind.

15. A solar cell array according to claim 14, wherein the rated voltages are classified into at least two kinds.

16. A solar cell array according to claim 14, wherein a voltage-power characteristics curve of said solar cell array has one power peak.

17. A solar cell array according to claim 14, wherein said solar cell strings do not all consist of the same number of solar cells connected in series.

18. A solar cell array according to claim 14, wherein said solar cell strings do not all consist of the same number of solar cell modules connected in series.

19. A solar cell array according to claim 18, wherein said solar cell strings consist of n, (n+m), (n 2m), - . . , and (n+Am) (where n, m, and A are positive integers) solar cell modules connected in series.

20. A solar cell array according to claim 18, said solar cell array having a solar cell string wherein a number of series solar cell modules is n and a solar cell string wherein a number of series solar cell modules is (n+1), where n is a positive integer.

21. A solar cell array according to claim 14, wherein at least one of said solar cell strings has two or more types of solar cell modules having a same rated current but different rated voltages.

22. A solar cell array according to claim 14, wherein said plurality of solar cell strings are installed on a plurality of mount planes and each of the solar cell strings is installed on a single mount plane.

23. A solar cell array according to claim 22, wherein each of said plurality of solar cell strings is comprised of solar cell modules of a same type and the whole of the solar cell array has solar cell modules of two or more types.

24. A solar cell array according to claim 23, wherein plural solar cell strings installed on a single mount plane have an identical rated voltage and wherein said rate voltage is different from that of solar cell strings installed on another mount plane.

25. A solar cell array according to claim 14, wherein solar cells of said solar cell array are amorphous silicon solar cells.

26. A solar cell array according to claim 14, wherein solar cell modules forming said solar cell strings are building-material-incorporated solar cell modules.

27. A solar electric power generation apparatus comprising:
   a solar cell array comprising a plurality of solar cell strings each of said solar cell strings comprising solar cells having different rated voltages, being connected in parallel and being the same kind; and
   a power control device connected to said solar cell array.

28. A solar power generation apparatus according to claim 27, wherein said power control device performs such a control as to maximize output power of said solar cell array.

* * * * *

UNITED STATES PATENT AND TRADEMARK OFFICE
CERTIFICATE OF CORRECTION

PATENT NO. : 6,111,188

DATED : August 29, 2000

INVENTOR(S) : SEIJI KUROKAMI ET AL.

It is certified that error appears in the above-identified patent and that said Letters Patent is hereby corrected as shown below:

COLUMN 1

Line 11, "environment" should read --environment--;
Line 34, "In" should read --in--; and
Line 37, "save" should read --same--.

COLUMN 2

Line 6, "multiples" should read --multiple-- and "the" should read --The--;
Line 14, "the" (second occurrence) should read --thus a--;
Line 41, "the" should read --all--; and
Line 42, "all" should read --the--.

COLUMN 4

Line 46, "point" should read --point--; and
Line 47, "by" should be deleted.

COLUMN 5

Line 9, "available" should read --available for--.

COLUMN 8

Line 42, "of" should read --from--; and
Line 53, "use" should read --use of--.

UNITED STATES PATENT AND TRADEMARK OFFICE
CERTIFICATE OF CORRECTION

PATENT NO. : 6,111,188

DATED : August 29, 2000

INVENTOR(S) : SEIJI KUROKAMI ET AL.

It is certified that error appears in the above-identified patent and that said Letters Patent is hereby corrected as shown below:

COLUMN 9

Line 45, "very" should read --very much--.

COLUMN 11

Line 47, "in the" (first two occurrences) should be deleted; and "In the morning" should read --Morning--; and
Line 51, "In the evening" should read --Evening--.

COLUMN 12

Line 16, "the all" should read --all the--.

COLUMN 13

Line 39, "the" (both occurrences) should be deleted.

UNITED STATES PATENT AND TRADEMARK OFFICE
CERTIFICATE OF CORRECTION

PATENT NO. : 6,111,188
DATED : August 29, 2000
INVENTOR(S) : SEIJI KUROKAMI ET AL.

It is certified that error appears in the above-identified patent and that said Letters Patent is hereby corrected as shown below:

<u>COLUMN 14</u>

Line 2, "cell" should read --cell strings--.
    Line 7, "strings" should read --strings consist of--;
    Line 38, "claims 1 and 2-11," should read --claims 1 to 11--; and
    Line 60, "(n 2m), - ..," should read --(n+2m),..., and--.

Signed and Sealed this

Twenty-ninth Day of May, 2001

*Attest:*

NICHOLAS P. GODICI

*Attesting Officer*     *Acting Director of the United States Patent and Trademark Office*